United States Patent [19]
Ide et al.

[11] Patent Number: 5,310,784
[45] Date of Patent: May 10, 1994

[54] ELECTROMAGNETIC WAVE SHIELDING MATERIAL

[75] Inventors: Isamu Ide, Sakai; Hisato Higuchi, Izumiootsu; Masanobu Nishikawa, Osaka; Shigehisa Ishihara, Nagaokakyo; Shuichi Kawai, Kyoto, all of Japan

[73] Assignee: Lignyte Co., Ltd., Osaka, Japan

[21] Appl. No.: 908,613

[22] Filed: Jun. 29, 1992

Related U.S. Application Data

[62] Division of Ser. No. 561,645, Aug. 1, 1990, abandoned.

[51] Int. Cl.$^5$ .............................................. C08L 61/04
[52] U.S. Cl. .................................... 524/876; 524/877; 524/594; 523/137; 250/505.1; 428/402; 252/502
[58] Field of Search ................. 526/88, 89; 250/505.1; 428/402; 524/876, 877, 594; 523/137; 252/502

[56] References Cited

U.S. PATENT DOCUMENTS

| | | | |
|---|---|---|---|
| 4,027,384 | 7/1977 | Connolly et al. | 29/592 |
| 4,474,685 | 10/1984 | Annis | 252/503 |
| 4,490,412 | 12/1984 | Yotuyanagi et al. | 427/122 |
| 4,775,455 | 10/1988 | Chandramouli et al. | 204/294 |

FOREIGN PATENT DOCUMENTS

| | | |
|---|---|---|
| 63-48320 | 3/1988 | Japan . |
| 1-234232 | 9/1989 | Japan . |
| 2-136486 | 5/1990 | Japan . |
| 2-197661 | 8/1990 | Japan . |

*Primary Examiner*—John Kight, III
*Assistant Examiner*—Duc Truong
*Attorney, Agent, or Firm*—Armstrong, Westerman, Hattori, McLeland & Naughton

[57] ABSTRACT

An electromagnetic wave shielding material comprises a composite carbon-resin compound obtained by reacting to proceed polymerization of a resin forming material with carbon powder intermixed therewith. The resulting compound has carbon powder substantially uniformly dispersed in the resin and exhibit superior electromagnetic wave shielding effect, in addition to good fire resistance. The resin may be phenol, melamine, furan or the like, and the carbon powder is preferred to be incorporated at a content of not less than 40% of the total weight.

8 Claims, 6 Drawing Sheets

ELECTROMAGNETIC WAVE SHIELDING MATERIAL

This application is a division of application Ser. No. 561,645 filed Aug. 1, 1990 (now abandoned).

BACKGROUND OF THE INVENTION

1. Field of the Invention

The present invention relates to an electromagnetic wave shielding material which contains carbon as a conductive ingredient.

2. Description of the Prior Art

As a highly advanced intelligent network is developed, electromagnetic waves generated from various kinds of electronic appliances and the like employing a digital technology have been remarkably closed. Such electromagnetic waves act on a computer, an industrial robot and the like to cause noises resulting in erroneous operations thereof, and therefore have been noted to cause serious environmental problems. To eliminate the problems caused by the electromagnetic waves, it is required both not to generate unserviceable electromagnetic waves from electronic devices and to keep the devices away from an influence of the electromagnetic wave from outside. In either case, an electromagnetic wave shielding material can provide an effective countermeasure. For the electromagnetic wave shielding material, a conductive compound plastic becomes noteworthy since it can be readily formed into any configuration of a device housing. The conductive compound plastic for use in the electromagnetic wave shielding material is generally a mixture of a resin and a conductive filler including powder, flake or fiber of a metal such as a copper, an aluminum, a zinc, a stainless steel and the like. However, the shielding materials employing the conductive metal material are still found to be unsatisfactory in that they cannot sufficiently shield a low frequency electromagnetic wave below 400 or 500 MHz as well as a high frequency electromagnetic wave above 600 or 700 MHz. In consideration of that carbon powder such as a graphite can be used as the conductive filler, studies have been made to investigate another electromagnetic wave shielding material comprising carbon powder mixed with a resin such as a phenol resin, and have revealed that the electromagnetic wave shielding material comprising the carbon powder intermixed with the phenol resin by means of a kneader and the like has an improved shielding effect rather than that employing the metallic conductive filler. Nevertheless, such shielding material is found to be still insufficient in shielding the low frequency electromagnetic waves below 400 or 500 MHz as well as the high frequency waves above 600 or 700 MHz.

SUMMARY OF THE INVENTION

The above insufficiency has been eliminated in the present invention which provides a superior electromagnetic wave shielding material capable of effectively shielding the electromagnetic waves over a wide frequency range, and in addition exhibiting superior fire resistance, which is therefore a primary object of the present invention. The electromagnetic wave shielding material in accordance with the present invention comprises a composite carbon-resin reaction compound prepared by reacting a resin forming material for polymerization of the resin forming material as being intermixed with carbon powder. The kinds of the resin utilized in the present invention is not limited, but a phenol resin, a melamine resin, and a furan resin are preferred.

DETAILED DESCRIPTION OF THE INVENTION

Figure 1:
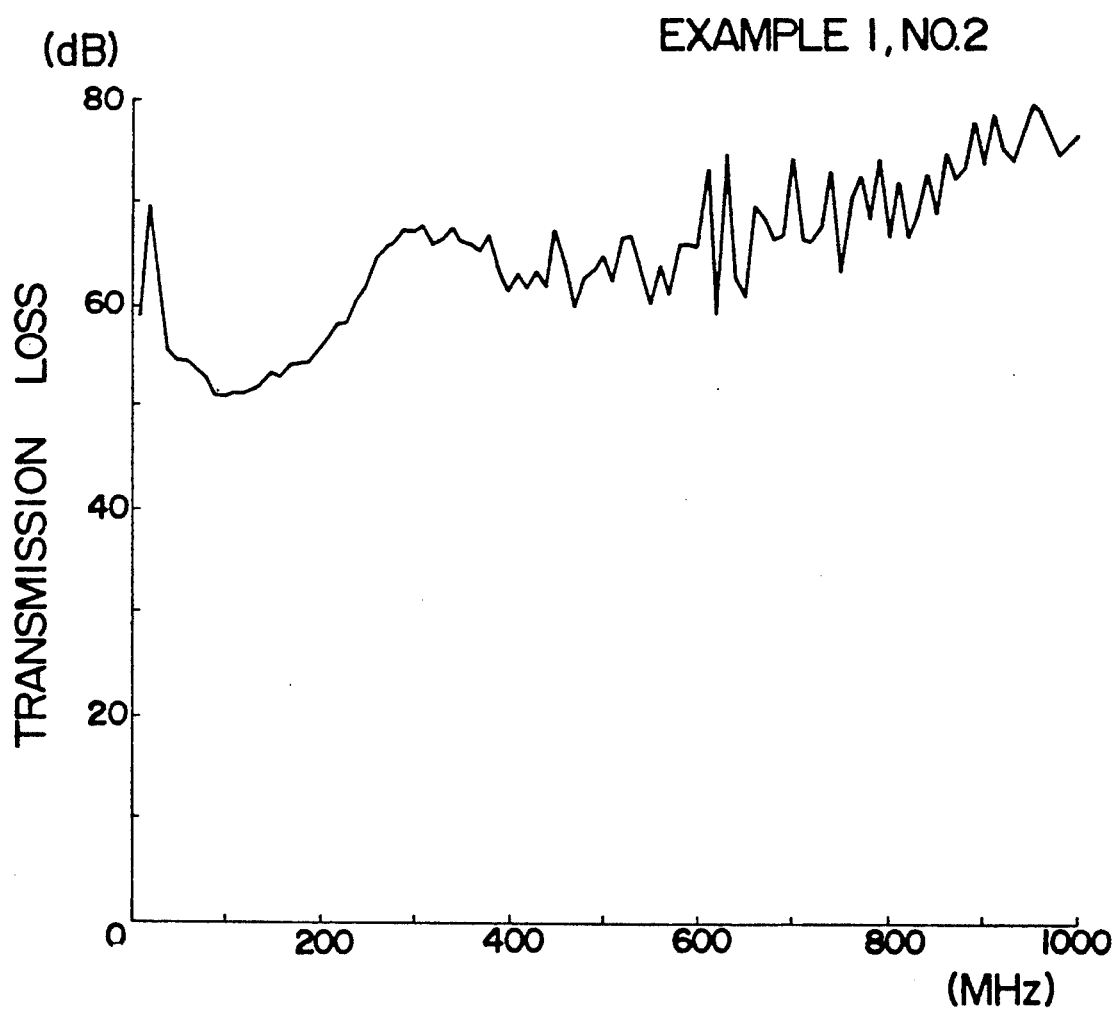
FIGS. 1 through 6, respectively, are diagrams showing the relations between transmission loss of the electromagnetic wave and frequency thereof.

Now, the present invention will be explained in detail. The carbon powder utilized in the present invention can be any carbonaceous powder including natural graphite, synthetic graphite, carbon black, powered coke, powdered charcoal, charcoal powder provided by burning branches, leaves, trunks and roots of a tree, a bamboo, grass, straws and husks of a rice plant and the like. Such carbonaceous powder can be utilized singly or in any combination. The particle size of the carbon powder is not limited, but it is preferable to have an average particle size of not more than 20 $\mu$m.

When phenol resin is intended to form a composite carbon-resin reaction compound with the carbon powder, phenols and formaldehyde are selected as the resin forming materials. These materials are reacted for polymerization in the presence of a catalyst as being intermixed with the carbon powder to obtain the composite carbon-resin compound in the form of granules. The term phenols utilized in the present invention is meant to include derivatives of phenols, such as a 3-functional groups consisting of m-cresol, resorcinol and 3,5-xylenol, a 4-functional group consisting of bisphenol-A and dihydroxydiphenylmethane, and a 2-functional and o- or p-substituted phenol group consisting of o-cresol, p-cresol, p-ter-butyrphenol, p-phenylphenol, p-cumulphenol, p-nonylphenol and 2,4- or 2,6-xylenol, and further include phenol halide substituted with chlorine or bromine. The above phenols can be used singly or in any combination. Although formaldehyde is preferably reacted with phenols in the form of an aqueous solution of a formalin, it may be available with a small or large portion thereof substituted by furfural or furfuryl alcohol. The reaction catalyst may include basic substances which can provide a —$NCH_2$ bond between benzene nuclei of phenols, for example, primary or secondary amines consisting of hexamethylenetetramine, ammonia, dimethyl amine, ethylene diamine and monoethanol amine. Further, the above catalyst can be utilized in combination with one or more additional catalysts including hydroxides of alkali metals or alkaline earth metals or other basic catalysts such as tertiary amines generally employed for synthesis of phenol resin.

The above phenol, formaldehyde and catalyst are placed in a reactor vessel or oven in order to react them in the presence of the carbon powders also supplied into the vessel. Preferably phenol and formaldehyde are incorporated at a molar ratio of 1:1 to 1:3.5. The above reaction is made also with an addition of water in an amount sufficient to facilitate stirring of the reaction system. At an initial reaction stage, the reaction proceeds with continued stirring to provide a viscous mayonnaise-like reaction product. As the reaction proceeds further, a condensation product of phenol and formaldehyde including the carbon powder begins to be separated from the water in the system, and is suddenly dispersed into the vessel in the form of black particles comprising the phenol resin and the carbon powder. Subsequent to the dispersion of the black particles, the reaction continues to further proceed the phenol resin forming process to a desired extent, after which the reaction system is cooled and the stirring is stopped to precipitate the black particles as being separated from the water. These black particles are minute spherical granules which can be easily separated by filtering after being removed from the vessel and are dried to obtain the composite carbon phenol resin compound granules having a diameter of preferably 10 $\mu$m to 2,000 $\mu$m.

Thus obtained carbon-phenol resin compound is utilized as an electromagnetic wave shielding material because of its superior workability enabling it to be formed into various configuration through injection molding, compression molding, transfer molding, extruding molding, or the like. For example, the material can be formed into a casing or cabinet of an electronic device in order to prevent an electromagnetic wave from leaking outside the device or from acting on the device from outside. In addition, it can be shaped into a plate or the like configuration adapted to be attached to or embedded in an external wall of a building or the like structure for electromagnetically shielding the entire structure. Further, it can be also shaped into an interior member to electromagnetically shielding an entire room. The electromagnetic shielding material is not limited to the above applications, and can be shaped into a suitable member which is adapted to any application field where the electromagnetic shielding is critical.

Alternatively, melamine resin may be used in place of the above phenol resin to form a composite carbon-melamine resin compound with the carbon powder. Melamine or its derivative is selected as a resin forming material and is reacted with like formaldehyde in the presence of a suitable catalyst for polymerization being with the carbon powder in the like manner as in the above case. An acid or alkali may be available as the catalyst.

When furan resin is intended to form a composite carbon-furan resin compound, suitable furan such as furfuryl alcohol is selected as a resin forming material and is reacted with or without a formalin while being intermixed with the carbon powder in the presence of a suitable catalyst such as an acid. Since the furan resin cannot be formed into granules as in the case of phenol or melamine resin, the resulting compound is required to be freeze-dried to be readily available as the electromagnetic shielding material.

Thus obtained carbon-resin compound can formed into an electromagnetic shield member which exhibits superior shielding effect over a wide frequency range, in contrast to the member made from a conventional material which is made simply by mixing the carbon powder with the resin such as phenol resin. In fact, although the conventional material is insufficient for shielding the electromagnetic wave of a low frequency less than 400 or 500 MHz as well as of a high frequency above 600 or 700 MHz, as described hereinbefore, the composite carbon-resin compound prepared in accordance with the present invention can certainly show superior shielding effect over those low and high frequencies. Although the reason for such superior shielding effect is not clear, it may result from uniform carbon dispersion which can be obtained in the present invention by mixing the carbon powder at the time of forming the resin, in contrast to the conventional material in which such uniform carbon dispersion is not expected due to bad wettability between the resin and the carbon powder.

To ensure sufficient shielding effect, it is preferable to adjust the specific gravity of the carbon-resin compound to not less than 0.5, preferably 1.0, since the shielding effect will be reduced with the compound having the specific gravity of less than 0.5 or 1.0. Further, the resin and the carbon powder are preferred to be incorporated to have a carbon content of not less than 40% by weight for assuring sufficient shielding effect.

Besides, the carbon-resin compound of the present invention can also exhibit superior fire-resistance due to the inclusion of the carbon powder. Therefore, it is possible to provide a fire-resistant layer or layers on a substrate including a wood board such as a plywood, particle board, laminated veneer lumber (LVL), inorganic board, such as calcium silicate board, woody cement board, slag gypsum plaster board, and the like construction board. When the carbon-resin compound is utilized to form the fire-resistant layer or layers, it can certainly shield a fire and protect the substrate therefrom. In this connection, the resin contained in the layer can be carbonized by the flame to produce a resulting carbonized layer which can serve as an insulator to protect the substrate from being exposed to a high temperature of the flame.

Now, the present invention will be explained by way of examples. All parts and percentage values are by weight unless stated otherwise.

EXAMPLE 1

1,100 parts of scale-like graphite having an average diameter of 5 $\mu$m, 770 parts of phenol, 1,328 parts of 68% formalin, 80 parts of hexamethylenetetramine as a catalyst, and 80 parts of water were placed and intermixed in a reactor vessel. The mixture was heated to a temperature of 90° C. by being stirred in 60 minutes and maintained at this condition for 3 hours to provide black granules consisting of the graphite and the resulting phenol resin. After being cooled, the granules were separated by filtering and dried to self-setting carbon-phenol resin compound for use as an electromagnetic wave shielding material. Thus obtained carbon-resin compound granules have an average diameter of 150 $\mu$m, a graphite content of 60%, and a phenol resin content of 40%.

EXAMPLE 2

1,100 parts of scale-like graphite having an average diameter of 5 $\mu$m, 385 parts of phenol, 664 parts of 37% formalin, 40 parts of hexamethylenetetramine as a catalyst, and 80 parts of water were placed and intermixed in a reactor vessel and were processed in the like manner as in Example 1 to prepare a like self-setting carbon-phenol resin compound. Thus obtained carbon-resin compound granules have an average diameter of 110 $\mu$m, a graphite content of 80%, and a phenol resin content of 20%.

EXAMPLE 3

1,100 parts of scale-like graphite having an average diameter of 5 $\mu$m, 200 parts of phenol, 340 parts of 37% formalin, 22 parts of hexamethylenetetramine as a catalyst, and 80 parts of water were placed and intermixed in a reactor vessel and were processed in the like manner as in Example 1 to prepare a like self-setting carbon-phenol resin compound. Thus obtained carbon-resin compound granules have an average diameter of 75 μm, a graphite content of 90%, and a phenol resin content of 10%.

EXAMPLE 4

1,100 parts of scale-like graphite having an average diameter of 5 μm, 980 parts of furfuryl alcohol, 405 parts of 37% formalin, 30 parts of 10% aqueous solution of phosphate as a catalyst, and 500 parts of water were placed and intermixed in a reactor vessel. The mixture was refluxed for 180 minutes followed by being cooled and removed of the water. Thereafter, it is freeze-dried to provide a slightly viscous and self-setting carbon-furan resin compound having a carbon content of 61.8% and a furan resin content of 38.2%.

EXAMPLE 5

1,100 parts of scale-like graphite having an average diameter of 5 μm, 750 parts of melamine, 960 parts of 37% formalin, 110 parts of 10% formic acid as a catalyst, and 1150 parts of water were placed and intermixed in a reactor vessel. The mixture was heated to a temperature of 70° C. in 30 minutes and kept for 240 minutes to proceed the reaction. Thereafter, the mixture was cooled, filtered and dried to provide a self-setting carbon-melamine resin compound having a carbon content of 58.5% and a melamine resin content of 41.5%.

COMPARATIVE EXAMPLE 1

600 parts of scale-like graphite having an average diameter of 5 μm and 615 parts of 65% methanol solution of solid resol type phenol resin were placed into a kneader and kneaded for 30 minutes. Subsequently, the kneaded mixture was air-dried to the methanol followed by being dried for 2 hours within a drying chamber maintained at a temperature of 45° C. Thereafter, it is roughly crushed by a crusher to pieces of carbon-resin mixture having a diameter of less than 1 mm, a carbon content of 60%, and a phenol resin content of 40%.

COMPARATIVE EXAMPLE 2

The same procedure was repeated as in Comparative Example 1 except that copper powder having an average diameter of 20 μm was incorporated in place of the graphite, to provide a copper-resin mixture material having a copper content of 60% and a phenol resin content of 40%.

Figure 2:
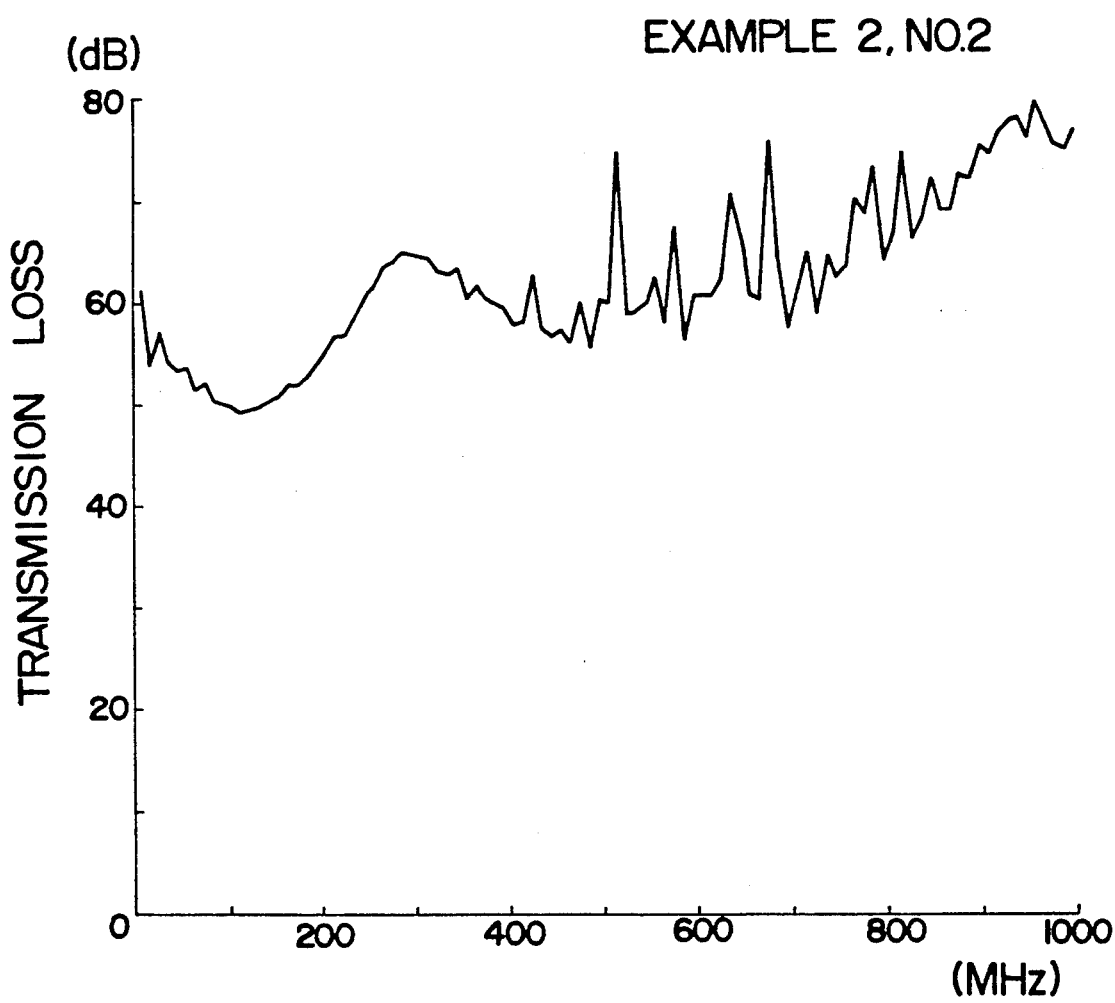
Figure 3:
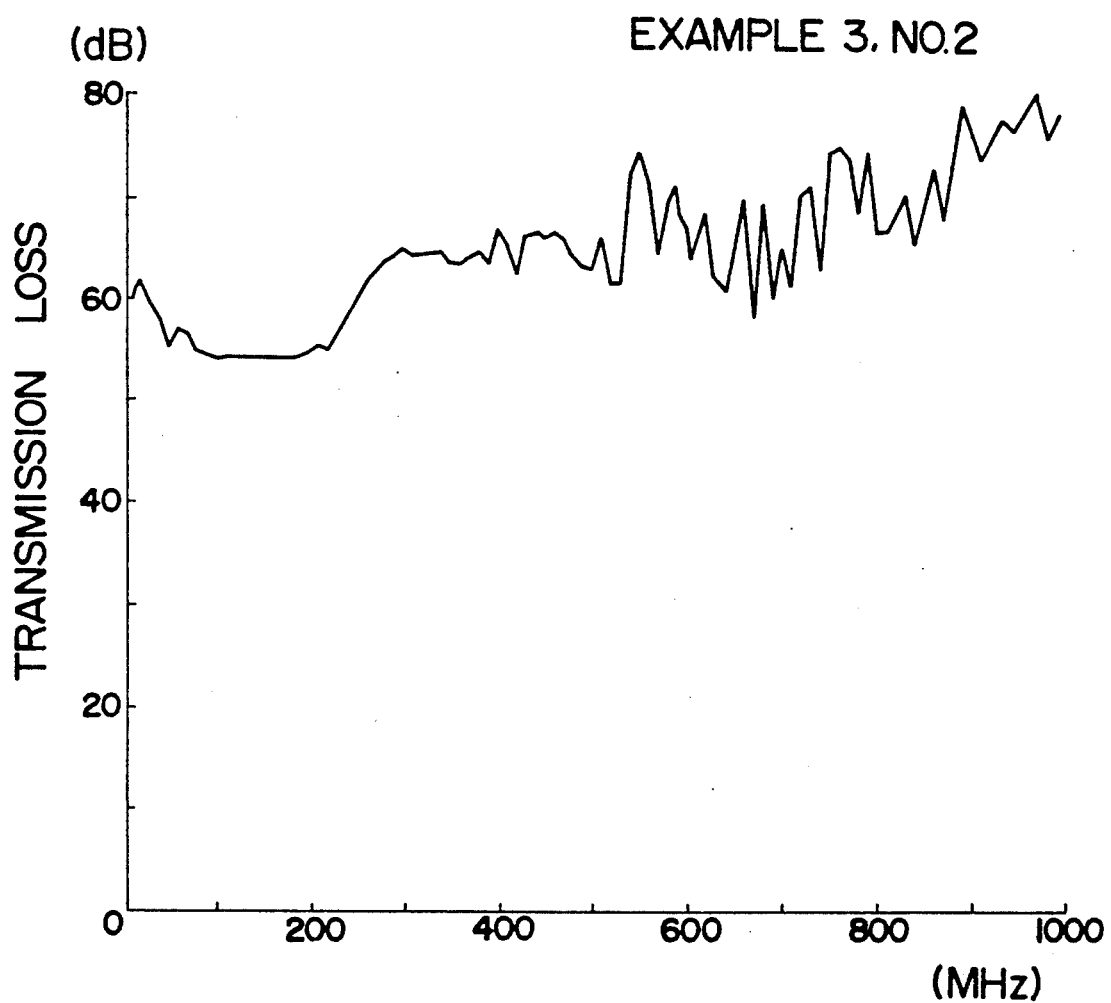
Figure 4:
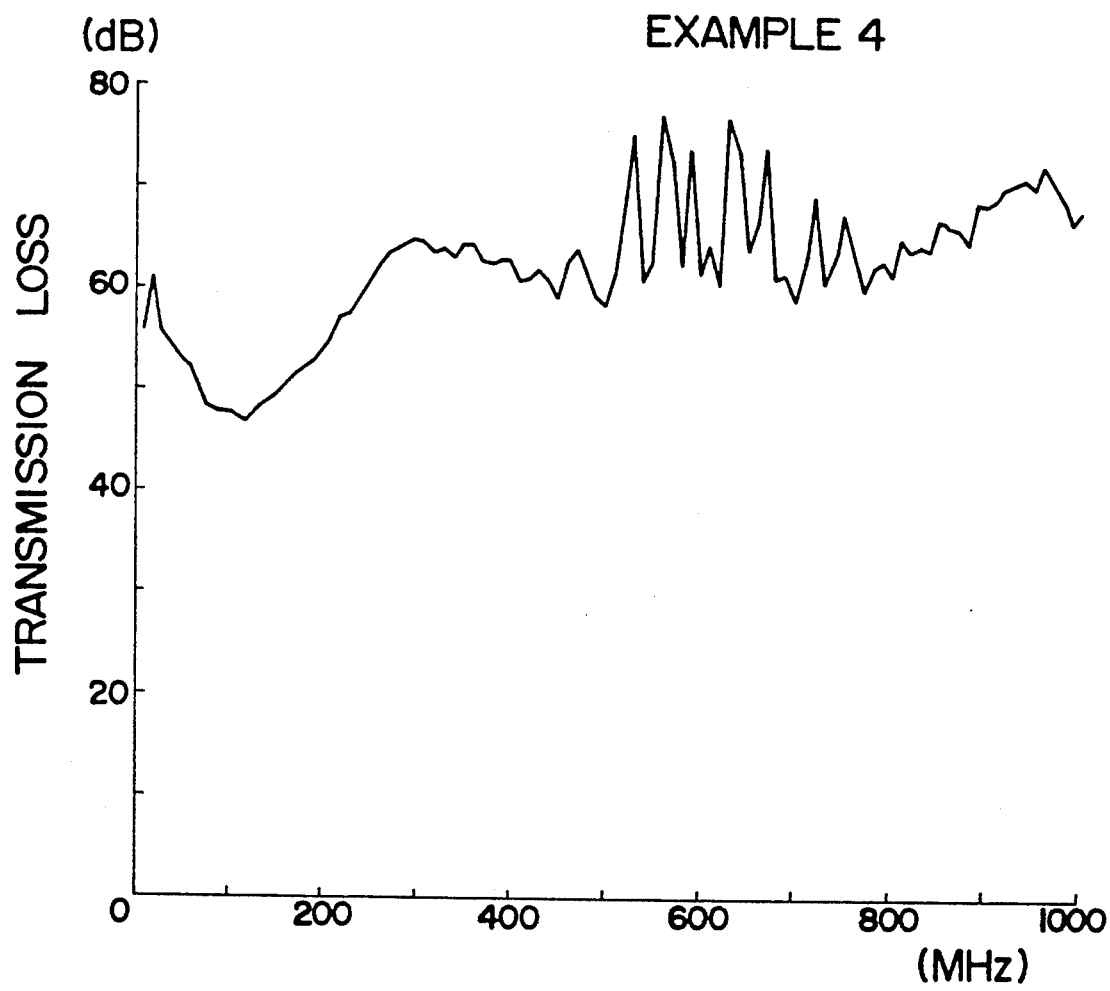
Figure 5:
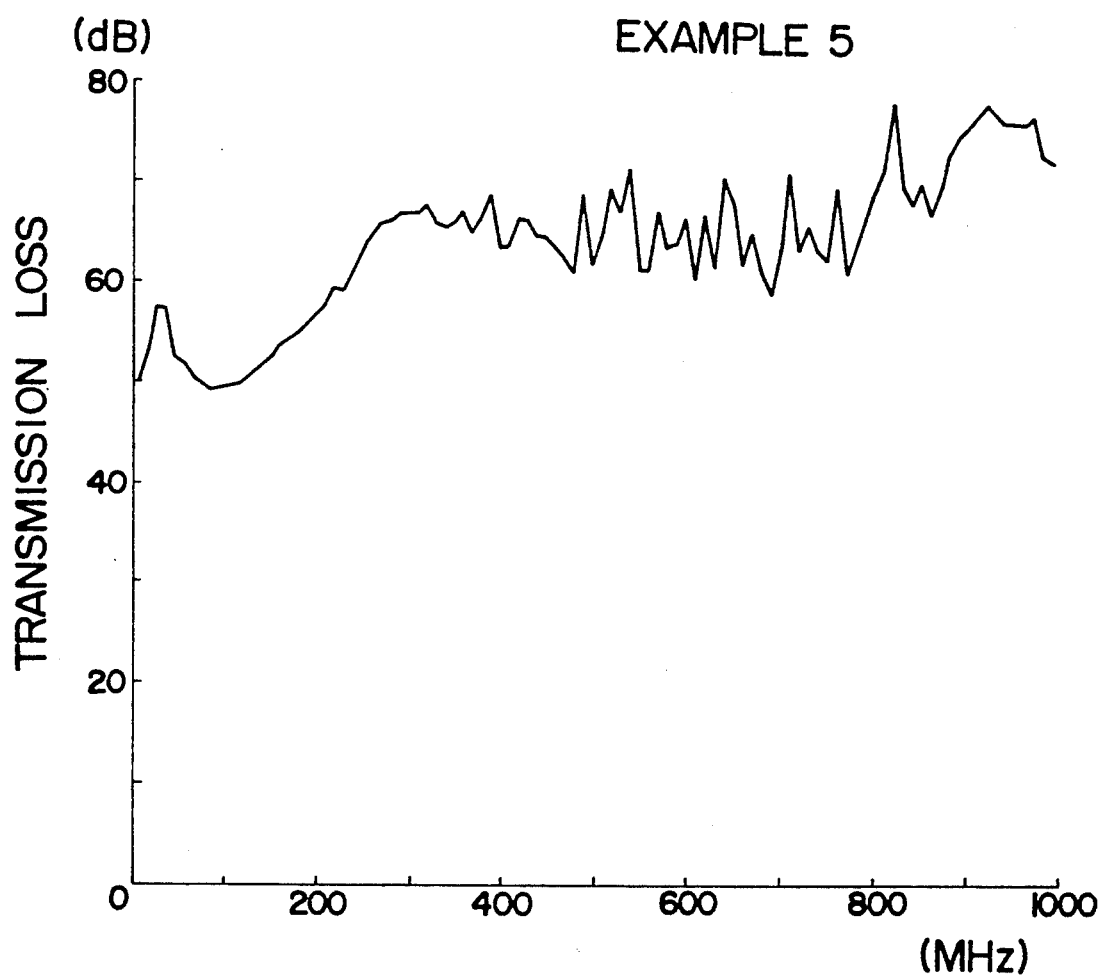
Figure 6:
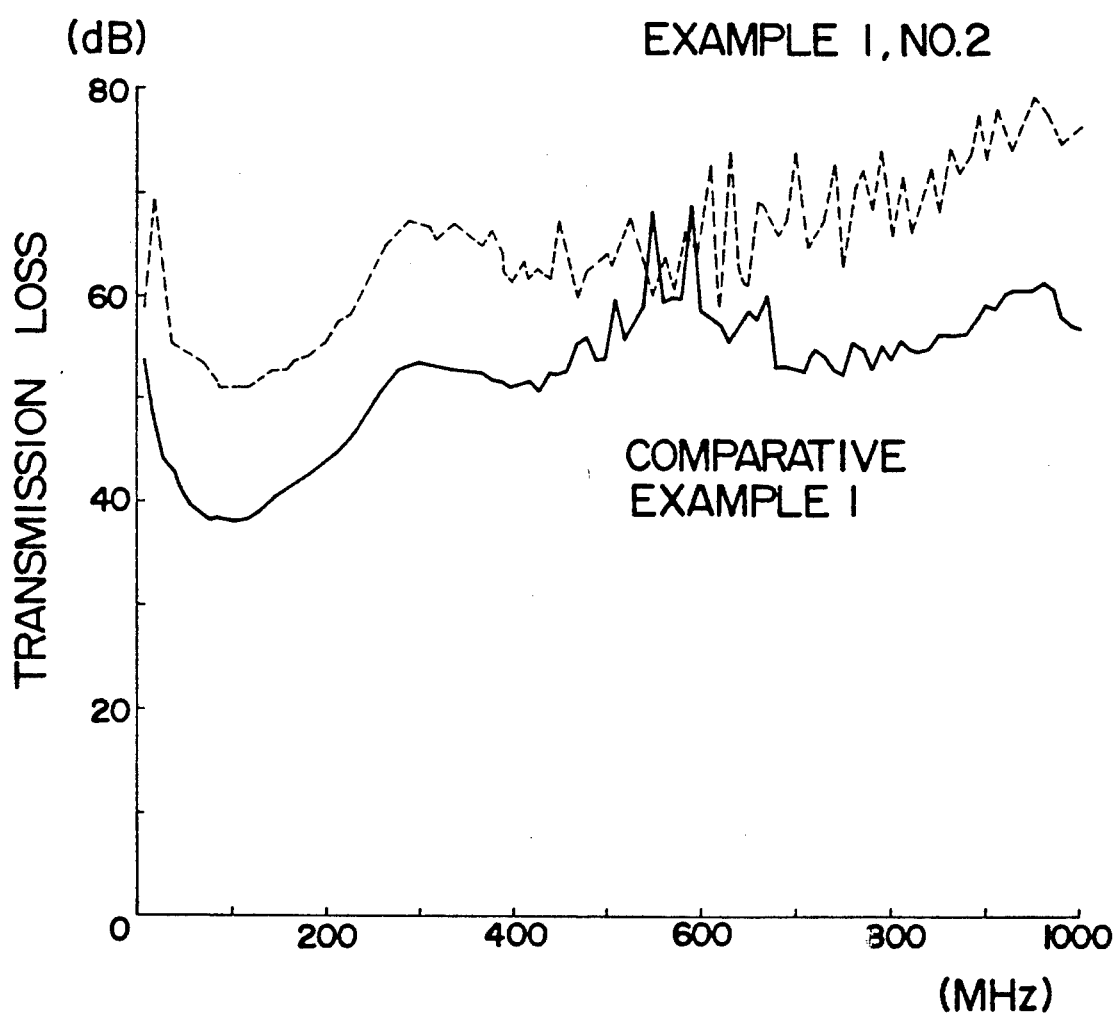

The compound thus obtained in Examples 1 to 5 and Comparative Examples 1 and 2 were each placed in a mold preheated to a temperature of 160° C. and heated for 10 minutes to provide individual plate measuring 150×70×3−4 mm. With regard to each of Examples 1 to 3, several plates of different specific gravities were fabricated, as shown in Table 1 below. These plates were examined to evaluate electromagnetic wave shielding effectiveness by means of transmission loss measured by Dual Chamber method, which is in conformity with ASTM ES7-83 (American Standard Test Method for Electromagnetic Shielding Effectiveness of Planar Material). The test results are listed in Table 1 and in FIGS. 1 to 6, in which FIG. 1 illustrates a relation between electromagnetic transmission loss and frequency obtained for No. 2 sample plate of Example 1; FIG. 2 illustrates the relation for No. 2 sample of Example 2; FIG. 3 does for No. 2 sample of Example 3; FIG. 4 does for Example 4; FIG. 5 does for Example 5; and FIG. 6 does for Comparative Example 1.

In addition, these plates were also tested to evaluate fire-resistance in accordance with a flame penetration test which determines a time required for a 150 mm length flame produced from a high temperature and high speed burner to burn and penetrate through the plate when such flame is applied perpendicular to the surface of the plate. The test results are also listed in Table 1.

TABLE 1

| | | thickness [mm] | weight [g] | specific gravity | surface density [g/cm²] | electromagnetic wave transmission loss [dB] frequency [MHz] | | | | fire resistance [minutes] by flame penetration test |
|---|---|---|---|---|---|---|---|---|---|---|
| | | | | | | 30 | 100 | 300 | 1000 | |
| Example 1 | No. 1 | 3.65 | 68.76 | 1.671 | 0.609 | 62.3 | 48.8 | 66.4 | 72.0 | over 120 |
| | No. 2 | 3.65 | 62.20 | 1.514 | 0.552 | 61.9 | 50.9 | 67.1 | 76.3 | over 120 |
| | No. 3 | 3.71 | 54.79 | 1.311 | 0.486 | 63.8 | 51.8 | 66.7 | 72.8 | over 120 |
| | No. 4 | 3.58 | 44.65 | 1.108 | 0.396 | 52.6 | 50.1 | 67.7 | 54.9 | over 120 |
| | No. 5 | 3.62 | 40.76 | 1.000 | 0.362 | 51.6 | 47.2 | 63.0 | 52.2 | over 120 |
| | No. 6 | 3.61 | 31.93 | 0.787 | 0.281 | 49.7 | 39.4 | 53.7 | 24.0 | 92 |
| Example 2 | No. 1 | 3.63 | 68.22 | 1.666 | 0.604 | 56.6 | 48.2 | 64.5 | 76.4 | over 120 |
| | No. 2 | 3.56 | 60.24 | 1.499 | 0.533 | 57.7 | 50.0 | 64.8 | 77.1 | over 120 |
| | No. 3 | 3.62 | 54.17 | 1.328 | 0.480 | 56.7 | 53.1 | 64.8 | 75.9 | over 120 |
| | No. 4 | 3.62 | 44.02 | 1.080 | 0.390 | 59.1 | 50.2 | 68.8 | 62.1 | over 120 |
| | No. 5 | 3.61 | 37.30 | 0.917 | 0.331 | 53.4 | 49.1 | 65.2 | 38.1 | over 120 |
| | No. 6 | 3.61 | 31.24 | 0.769 | 0.277 | 52.4 | 44.1 | 55.5 | 27.1 | 88 |
| Example 3 | No. 1 | 3.26 | 58.10 | 1.577 | 0.513 | 63.0 | 55.3 | 71.6 | 80.5 | over 120 |
| | No. 2 | 2.42 | 36.86 | 1.344 | 0.325 | 59.7 | 53.9 | 64.9 | 81.1 | over 120 |
| | No. 3 | 3.31 | 44.13 | 1.176 | 0.389 | 59.6 | 60.0 | 76.0 | 76.2 | over 120 |
| | No. 4 | 2.19 | 32.94 | 1.328 | 0.290 | 58.5 | 51.0 | 64.1 | 81.0 | over 120 |
| Example 4 | | 3.58 | 67.8 | 1.653 | 0.592 | 55.6 | 47.6 | 64.8 | 67.5 | over 120 |
| Example 5 | | 3.59 | 68.3 | 1.656 | 0.595 | 57.5 | 49.3 | 66.7 | 72.4 | over 120 |
| Comparative Example 1 | | 3.17 | 56.28 | 1.578 | 0.500 | 44.3 | 38.2 | 53.6 | 57.1 | 68 |
| Comparative Example 2 | | 3.28 | 65.43 | 1.775 | 0.582 | 40.4 | 34.2 | 55.1 | 53.2 | 28 |

As apparent from comparison of FIGS. 1 to 5 to FIG. 6, it is concluded that the composite carbon-resin compounds the present invention exhibit superior electromagnetic shielding effect over a wide frequency range from a low frequency of less than 400 or 500 MHz to a high frequency of above 600 or 700 MHz. Also as confirmed from Table 1, Examples 1 to 5 of the present invention shown superior fire resistance.

What is claimed is:

1. A method for shielding electromagnetic wave generating sources, comprising applying a composite carbon-resin compound to said source, said composite carbon-resin compound being prepared by mixing carbon powder with a resin-forming material selected from the group consisting of phenol and formaldehyde; melamine and formaldehyde; and furan and polymerizing the resin-forming material.

2. The method of claim 1, wherein said resin-forming material is phenol and formaldehyde and said compound is in the form of carbon-phenol resin granules.

3. The method of claim 1, wherein said resin-forming material is melamine and formaldehyde and said compound is in the form of carbon-melamine resin granules.

4. The method of claim 1, wherein said carbon-resin compound has a carbon powder content of not less than 40% by weight.

5. A device comprising an electromagnetic wave generating component and a shield for said component, said shield comprising a composite carbon-resin compound prepared by mixing carbon powder with a resin-forming material selected from the group consisting of phenol and formaldehyde; melamine and formaldehyde; and furan and polymerizing the resin-forming material.

6. The device of claim 5, wherein said resin-forming material is phenol and formaldehyde and said compound is in the form of carbon-phenol resin granules.

7. The device of claim 5, wherein said resin-forming material is melamine and formaldehyde and said compound is in the form of carbon-melamine resin granules.

8. The device of claim 5, wherein said carbon-resin compound has a carbon powder content of not less than 40% by weight.

* * * * *